United States Patent
Brunschwiler et al.

(10) Patent No.: US 10,777,496 B2
(45) Date of Patent: Sep. 15, 2020

(54) CHIP PACKAGES WITH SINTERED INTERCONNECTS FORMED OUT OF PADS

(71) Applicant: INTERNATIONAL BUSINESS MACHINES CORPORATION, Armonk, NY (US)

(72) Inventors: Thomas J. Brunschwiler, Thalwil (CH); Luca Del Carro, Adliswil (CH); Jonas Zürcher, Chur (CH)

(73) Assignee: International Business Machines Corporation, Armonk, NY (US)

( * ) Notice: Subject to any disclaimer, the term of this patent is extended or adjusted under 35 U.S.C. 154(b) by 69 days.

(21) Appl. No.: 15/726,526

(22) Filed: Oct. 6, 2017

(65) Prior Publication Data
US 2019/0109084 A1 Apr. 11, 2019

(51) Int. Cl.
H01L 23/48 (2006.01)
H01L 23/498 (2006.01)
H01L 23/00 (2006.01)

(52) U.S. Cl.
CPC .. *H01L 23/49838* (2013.01); *H01L 23/49811* (2013.01); *H01L 23/49866* (2013.01); *H01L 24/05* (2013.01); *H01L 24/13* (2013.01); *H01L 24/16* (2013.01); *H01L 24/81* (2013.01); H01L 24/11 (2013.01); H01L 2224/0401 (2013.01); H01L 2224/05073 (2013.01); H01L 2224/05082 (2013.01); H01L 2224/05147 (2013.01);
(Continued)

(58) Field of Classification Search
CPC ......... H01L 23/49811; H01L 23/49838; H01L 23/49866; H01L 24/05; H01L 21/11; H01L 24/13; H01L 24/14; H01L 24/16; H01L 24/81

USPC .................................. 257/737; 438/612–616
See application file for complete search history.

(56) References Cited

U.S. PATENT DOCUMENTS

2005/0266670 A1* 12/2005 Lin ...................... H01L 21/563
                                                            438/613
2008/0279498 A1   11/2008 Sampsell et al.
(Continued)

OTHER PUBLICATIONS

Osborn, "All-Copper Chip-To-Substrate Interconnects for High Performance Integrated Circuit Devices," Georgia Institute of Technology Dissertation, May 2009, p. 1-103, School of Chemical and Biomolecular Engineering.
(Continued)

*Primary Examiner* — Brook Kebede
(74) *Attorney, Agent, or Firm* — Robert C. Bunker (57) ABSTRACT

The present invention is directed to a method for interconnecting two components. The first component includes a first substrate and a set of structured metal pads arranged on a main surface. Each of the pads includes one or more channels, extending in-plane with an average plane of the pad, so as to form at least two raised structures. The second interconnect component includes a second substrate and a set of metal pillars arranged on a main surface. The structured metal pads are bonded to a respective, opposite one of the metal pillars, using metal paste. The paste is sintered to form porous metal joints at the level of the channels. Metal interconnects are obtained between the substrates. During the bonding, the metal paste is sintered by exposing the structured metal pads and metal pillars to a reducing agent. The channels and raised structures improve the penetration of the reducing agent.

3 Claims, 4 Drawing Sheets

(52) U.S. Cl.
CPC .............. *H01L 2224/05155* (2013.01); *H01L 2224/05164* (2013.01); *H01L 2224/05551* (2013.01); *H01L 2224/05552* (2013.01); *H01L 2224/05553* (2013.01); *H01L 2224/05555* (2013.01); *H01L 2224/05557* (2013.01); *H01L 2224/05624* (2013.01); *H01L 2224/05644* (2013.01); *H01L 2224/05647* (2013.01); *H01L 2224/05655* (2013.01); *H01L 2224/05664* (2013.01); *H01L 2224/1182* (2013.01); *H01L 2224/11822* (2013.01); *H01L 2224/13566* (2013.01); *H01L 2224/13694* (2013.01); *H01L 2224/13747* (2013.01); *H01L 2224/1601* (2013.01); *H01L 2224/16227* (2013.01); *H01L 2224/81026* (2013.01); *H01L 2224/81065* (2013.01); *H01L 2224/8184* (2013.01); *H01L 2224/81191* (2013.01); *H01L 2224/81192* (2013.01); *H01L 2224/81193* (2013.01); *H01L 2224/81203* (2013.01); *H01L 2224/81345* (2013.01); *H01L 2224/81385* (2013.01); *H01L 2224/81424* (2013.01); *H01L 2224/81444* (2013.01); *H01L 2224/81447* (2013.01); *H01L 2224/81455* (2013.01); *H01L 2224/81464* (2013.01)

(56) References Cited

U.S. PATENT DOCUMENTS

| | | |
|---|---|---|
| 2012/0257343 A1 | 10/2012 | Das et al. |
| 2012/0261819 A1 | 10/2012 | Brunschwiler et al. |
| 2012/0306104 A1* | 12/2012 | Choi ................... H01L 21/565 257/782 |
| 2014/0159203 A1* | 6/2014 | Liu ..................... H01L 24/81 257/536 |
| 2014/0252598 A1* | 9/2014 | Yu ...................... H01L 24/14 257/737 |
| 2014/0305684 A1 | 10/2014 | Kang et al. |
| 2015/0137354 A1 | 5/2015 | Foong et al. |
| 2016/0181217 A1 | 6/2016 | Prack |
| 2016/0218057 A1 | 7/2016 | Lee et al. |
| 2016/0351529 A1 | 12/2016 | Brunschwiler et al. |
| 2016/0365328 A1 | 12/2016 | Graf et al. |

OTHER PUBLICATIONS

Shahane et al., "Novel High-Temperature, High-Power Handling All-Cu Interconnections Through Low-Temperature Sintering of Nanocopper Foams," IEEE 66th Electronic Components and Technology Conference (ECTC), 2016, p. 829-836.

Zenou et al., "Laser Sintering of Copper Nanoparticles," Journal of Physics D: Applied Physics, 2014, p. 1-11, vol. 47, IOP Publishing Ltd.

Zürcher et al., "All-Copper Flip Chip Interconnects by Pressureless and Low Temperature Nanoparticle Sintering," IEEE 66th Electronic Components and Technology Conference (ECTC), 2016, p. 343-349.

\* cited by examiner

CHIP PACKAGES WITH SINTERED INTERCONNECTS FORMED OUT OF PADS

BACKGROUND

The present invention relates in general to the field of microelectronic packages, components thereof and methods to bond such components and obtain such packages. In particular, the present invention relates to techniques to obtain metal interconnects based on metal pads (e.g., copper pads) structured to ease the penetration of the reducing agent.

Various bonding processes are known, which involve solders, such as the so-called mass-reflow solder, copper-pillar solder reflow and copper-pillar compression techniques. Such techniques allow a range of interconnect pitches to be obtained (namely from 20 to 130 μm), with different qualities of interconnects.

The above techniques all involve an isothermal sintering step to bind opposite components of the package. It has also been proposed to apply copper-paste on copper pillars of one of these components, in order to bind the components by sintering. Formic acid enriched nitrogen is typically used as a reducing agent to remove the copper oxide formed during the material fabrication and handling during the bonding process. Other reducing agents, such as formic gas can be used as well. This makes it possible to obtain a satisfactory electrical conduction through the interconnects.

SUMMARY

According to a first aspect, the present invention is embodied as an interconnect component. The latter comprises a substrate and a set of structured metal pads arranged on a main surface of the substrate. The pads are designed for fabricating metal interconnects with respective metal pillars on an opposite substrate. Each of the structured metal pads comprises one or more channels. Each of the channels extends in-plane with the average plane of their respective pads, so as to form at least two raised structures thereon.

According to another aspect, the present invention is embodied as a set including a first interconnect component, such as described above. The set further comprises a second interconnect component, which includes a second substrate and a set of metal pillars arranged on a main surface thereof. The pads of the first components are adapted for fabricating metal interconnects with respective metal pillars on the second substrate. The second interconnect component may for instance comprise electronic components in electrical communication with at least some of the metal pillars.

The two components may be provided separately, or together but in a non-assembled state. However, in embodiments, the structured metal pads of the first component are bonded to respective, opposite metal pillars of the second component, due to metal paste, (e.g., so as to form a microelectronic package). The paste is sintered; it forms porous metal joint(s) at the level of the channel(s), so as for the pads and pillars to form metal interconnects between the first and second substrates.

According to a final aspect, the present invention is embodied as a method for interconnecting two interconnect components such as described above. This method relies on bonding each of the structured metal pads to a respective, opposite one of the metal pillars, due to metal paste. As said above, the paste is sintered so as to form porous metal joint(s) at the level of the channel(s), in order to obtain metal interconnects between the first and second substrates. During the bonding, the metal paste is sintered and the structured metal pads and metal pillars are exposed to a reduction agent or reaction product(s) thereof.

Devices methods embodying the present invention will now be described, by way of non-limiting examples, and in reference to the accompanying drawings.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

The accompanying drawings show simplified representations of devices or parts thereof, as involved in embodiments. Technical features depicted in the drawings are not necessarily to scale. Similar or functionally similar elements in the figures have been allocated the same numeral references, unless otherwise indicated.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

Referring to FIGS. 4A-4D, an aspect of the present invention is first described, which concerns a method for interconnecting two components 11, 12 of, e.g., a chip package.

Figure 1:
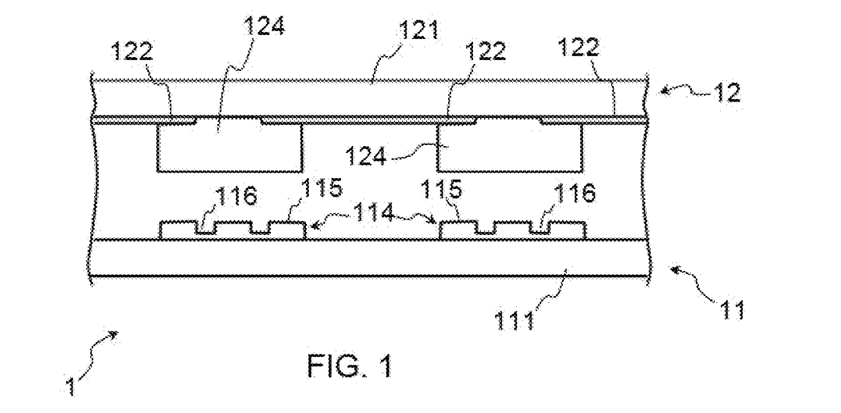
FIG. 1 is a 2D cross-sectional view of a set of interconnect components, before assembly (pads and pillars are not bonded yet), as in embodiments.

As seen in FIG. 1, the first interconnect component 11 comprises a substrate 111, as well as a set of structured metal pads 114 that are arranged on a main surface of this substrate 111. Each of the structured metal pads 114 comprises one or more channels 116. Any such channel extends in-plane with (i.e., parallel to) the average plane of its respective pad 114, so as to form at least two raised structures 115 thereon. The metal pads 114 are typically patterned during a previous step (e.g., using electroplating methods, not shown), so as obtain the desired channels 116 and raised structures 115.

As further seen in FIG. 1, the second interconnect component 12 too comprises a substrate 121. This component 12 further includes a set of metal pillars 124 arranged on a main surface of the substrate 121.

The manufacturer may provide any or each of these components 11, 12 separately from the other, or together but in a non-assembled state. However, in variants as specifically contemplated in the present methods, each of the structured metal pads 114 of the first component 11 may be bonded S20-S40 to a respective, opposite metal pillar 124 of the second component, using metal paste 22, 22a, in order to interconnect the components 11, 12. The metal paste is sintered so as to form porous metal joints 118 at the level of the channels 116.

During the bonding step S40, the metal paste 22, 22a is sintered while exposing the structured metal pads 114 and metal pillars 124 to a reduction agent or one or more reaction products thereof. This makes it possible to obtain electrically conductive metal interconnects 134 between the first substrate 111 and the second substrate 121.

Figure 4A:
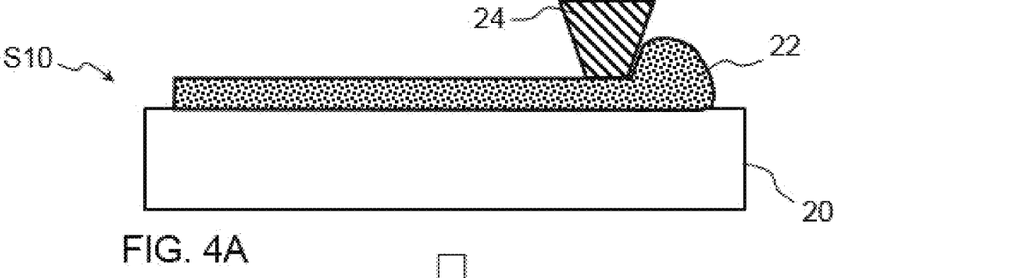
FIGS. 4A-4D is a sequence of 2D cross-sectional views illustrating high-level fabrication steps of a chip package, according to embodiments.
Figure 4B:
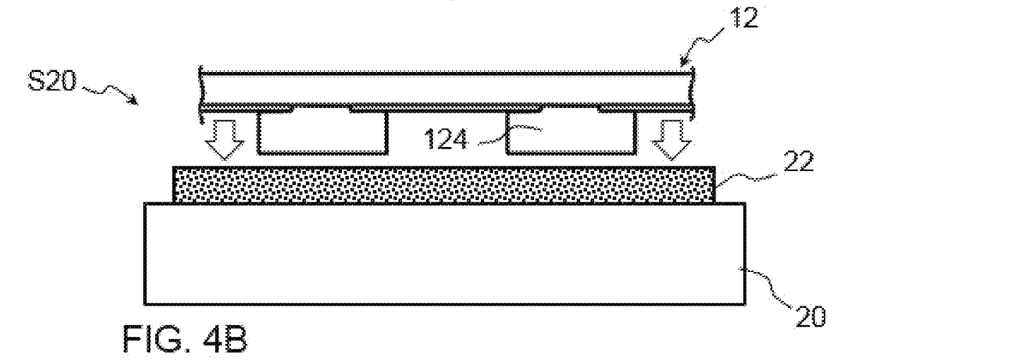
Figure 4C:
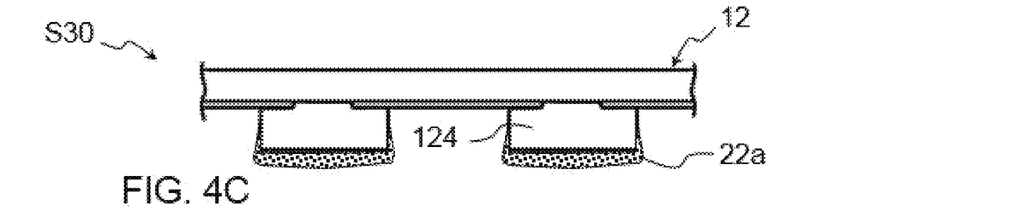
Figure 4D:
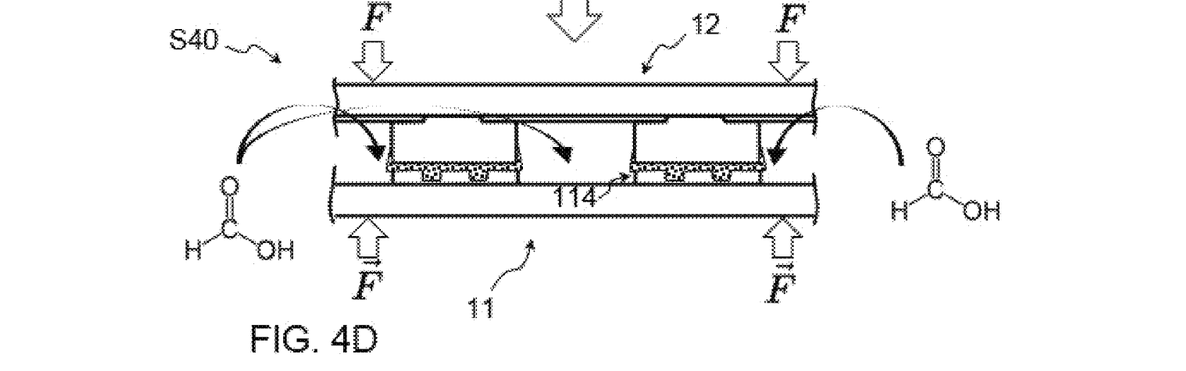

In preferred embodiments, the structured metal pads 114 are applied S40 with bonding pressure to the respective, opposite metal pillars 124, as suggested in FIG. 4D. Reasons for doing so are discussed below in detail.

Various reduction agents can be contemplated, starting with formic acid. Preferably though, the concentration of formic acid vapor is controlled, during the bonding step, by mixing the formic acid vapor with a gas such as nitrogen. The latter is used as carrier gas and it does not participate in the reduction chemical reactions. Reaction by-products, such as carbon monoxide and hydrogen gas, may happen to be recirculated and hence further participate in the reduction chemical reactions. More generally, any suitable reducing agent can be contemplated to remove the oxide formed during the material fabrication and handling, so as to obtain satisfactorily conductive interconnects 134.

Preferred embodiments involve a dipping transfer method. In other words, the structured metal pads 114 and/or the metal pillars 124 may be dipped S20-S30 into a metal paste 22 (FIG. 4B), prior to applying S40 the structured metal pads 114 to respective, opposite metal pillars 124. To that aim, the metal paste 22 may for instance be applied S10 on a substrate 20, using any suitable spreading tool 24. Embodiments illustrated in FIGS. 4A-4C assume that only the pillars 124 are dipped into the metal paste 22, resulting in paste residues 22a adhering on the lower surface of the pillars (FIG. 4C). According to at least one other embodiment, only the pads 114 or each of the pads and pillars can be dipped into metal paste 22. According to yet another embodiment, instead of dipping transfer methods, other methods such as the so-called dispensing, screen printing or stencil printing methods may be relied on, as known per se.

The first interconnect component 11, which concerns an independent aspect of the invention, will now be discussed in detail. As seen in FIG. 1, and also in FIGS. 3, 5 and 6, each metal pad 114 includes at least one in-plane channel 116. Yet, and as seen in FIGS. 3A-3E, the pads may include two or more channels 116. A channel 116 is typically formed as a trench, or a groove, extending in-plane with (i.e., parallel to) the average plane of its respective pad 114 and thus parallel to the upper plane of the pad. The channels 116 ideally extend parallel to the average plane of the substrate 111, on which the pads 114 are arranged. A channel 116 results in two outer, raised structures 115. The raised structures 115 can also be referred to as pedestals. A channel 116 shall typically have a rectangular section or a rounded section. Yet, since the pads 114 are preferably electroplated, the section is typically rectangular, as assumed in the accompanying drawings. In variants, etching techniques may be used, which may possibly result in channels with rounded sections.

The pads 114 are designed to fabricate metal interconnects 134 with respective metal pillars 124 on an opposite substrate 121, for example, using a dipping transfer method such as described above. The pads 114 accordingly form platforms for the metal pillars 124. The pads 114 preferably are electroplated copper pads. In variants, aluminum pads may be contemplated. Similarly, the opposite pillars may include copper or aluminum. Copper is preferred, owing to its very high electrical conductivity. However, in other variants, the interconnects 134 may also be formed by sintering from nano- or micro-metal particles. Thus, more generally, metal pads and metal pillars are assumed.

Remarkably here, the presence and configuration of the channels 116 allows an improved penetration of the reducing agent during the sintering process. This, eventually, results in improved metal interconnects 134, which may possibly be arranged with a small pitch while having satisfactory electrical properties. The channels 116 help in the evaporation of the solvent contained in the metallic paste (e.g., copper paste) used during the bonding process, to obtain the interconnects 134.

For example, assuming that a copper paste is used, the reduction of the native copper oxide allows a sintering of the copper paste 22a to be performed, typically at a temperature of about 200° C. For example, formic acid enriched nitrogen can be used as a reducing agent, at temperatures above 150° C. Once the copper oxide is reduced, the copper paste starts immediately to sinter.

A non-complete sintering of the copper joint may occur due to the limited penetration length of the reducing agent in the metal paste, especially if a bonding pressure is applied, as in preferred embodiments. Therefore, during the sintering process, the periphery of the copper joint is rapidly reduced as it starts to sinter. This phenomenon happens to close the porosity of the joint and, in turn, hinders the penetration of the reducing gas toward the center of the interconnect. The limited penetration of the reducing agent limits the effective area of the metal (e.g., copper) joint 118, 119, which in turn limits the electrical contact between the pad 114 and the opposite pillar 124. In that respect, the metal paste is typically not conductive (or has a very limited conductivity) before sintering or if not sufficiently reduced. Therefore, channels 116 may advantageously be provided on the pads 114 to improve the penetration of the reducing gas and eventually decrease the resistivity of the obtained interconnect 134, at the level of the joints 118, 119.

Applying pressure during the sintering process is desired as this allows achieving a low porosity region 119 (whose porosity is typically less than 20 or 30%). This, in principle, improves performance, compared to interconnects obtained without applying any pressure. Note, however, the applied pressure may have little impact on the porosity of the inner joint 118. Still, applying pressure may be desired to improve the horizontal joint 119. Note that if the porosity is sufficiently high (e.g., 20% porosity or more), the pores in the metal paste are sufficiently open, which allows a sufficient penetration of the reducing gas. However, when applying pressure, a closed pore joint structure 119 typically results which limits the penetration of the reducing agent. This, eventually, impacts the reduction reactions, whence the benefit of the channels 116, which can compensate for this as they improve the penetration of the reducing agent, notwithstanding the applied pressure.

It is therefore of advantage to rely on structured pads 114. Aspects of the invention therefore concern a component 11, comprising such structured pads 114, as well as a set of components 11, 12, which further includes the counterpart component 12.

In typical embodiments, the opposite substrate 121 (i.e., comprising the metal pillars 124) comprises electronic components and thus make up an integrated circuit chip. Note that the substrate 111 with pads 114 does not necessarily include electronic components. However, this configuration may be reversed (e.g., only the substrate 111 comprises electronic components) or symmetrized (e.g., electronic components are arranged on both substrates 111, 121). In that case, electronic components would likely be arranged in electrical communication with part or all of the metal pads 114.

Thus, in general, structured pads 114 may be provided on either side 111, 121, or on each side 111, 121. In addition, the thickness (or height) of the opposite pillars 124 (or of opposite structured pads) need not systematically be larger than that of the pads 114. For example, shallow pillars and thick structured pads may be used on respective sides 111, 121, or have similar heights or, still, structured pads may be involved on each side 111, 121, which may have similar or different heights, contrary to the assumption made in the accompanying drawings.

In this description, the terminologies "structured metal pads" and "metal pillars" respectively may refer to pads and pillars that comprise at least 80% of pure metal (e.g., copper), and preferably more than 90% (or even 95%) of pure metal. As said, the pads are typically made of copper. However, the pads may possibly be coated with nickel, nickel/gold, palladium, or palladium/gold, during their preparation. Thus, owing to the possible presence of residues in (on) the pads, the latter may not necessarily be made of pure metal.

Referring now more specifically to FIGS. 3A-3E, some, or each of the structured metal pads 114a-e preferably comprise two or more channels 116a-e, each extending in-plane with the average plane of their respective pads. Note that the pads 114a and 114b have a structure compatible with the cross-sections assumed in FIGS. 1, 2 and 5. Two or more channels form at least three raised structures 115a-e on a pad 114a-e. More generally, a pad may comprise n channels (n=1, 2, 3, 4, . . . as in FIGS. 3A-3E). The n channels may extend parallel to each other (as in FIGS. 3A, 3C), hence giving rise to n+1 structures, like bars (as in FIG. 3A. Channels may also be transversely arranged, to form an array, as in FIG. 3B. In the latter case, assuming n=n1+n2 channels are formed, including a first set of n1 parallel channels and a second set of n2 channels extending, each, transversely to the n1 channels, then typically (n1+1)×(n2+1) raised structures 115b are formed on the pad. In all cases, the raised structures may form a 1D or 2D pattern of repeating structures, possibly identically repeated (as in FIG. 3A, 3B or 3D), such as to form a regular array (as in FIG. 3A or 3B), or not (FIG. 3D, where the raised structures 115d are nevertheless rotationally symmetric). More sophisticated arrangements can be contemplated (as in FIG. 3E).

In general, increasing the channels may improve the reduction gas penetration. However, additional technical considerations may come into play. For example, channels 116a may form a 1D pattern of regularly spaced parallel bars 115a (or post), as in FIG. 3A, or a 2D pattern of repeating mesas 115b, as in FIG. 3B. In some embodiments, repeating bars 115a may be preferred, where redistribution lines come to contact the lower pads 114. This is to mitigate (or prevent) possible electromigration effects that may arise due to current crowding in the low porosity copper layer, rather than the high porosity copper layer, as discussed later in reference to FIGS. 5 and 6. More or less sophisticated variants can be contemplated, as illustrated in FIGS. 3B-3E, to improve the gas penetration and optimize the interconnect area by achieving a low porosity interconnect layer 119.

Figure 3A:
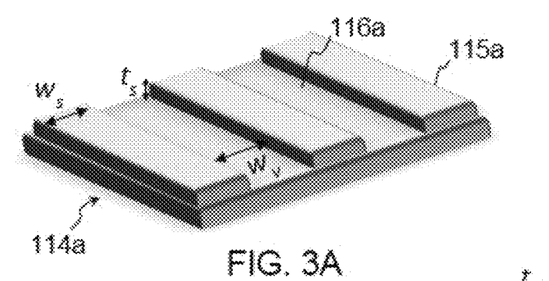
FIGS. 3A-3E show various metal pads, structured so as to comprise in-plane channels, as involved in embodiments.
Figure 3B:
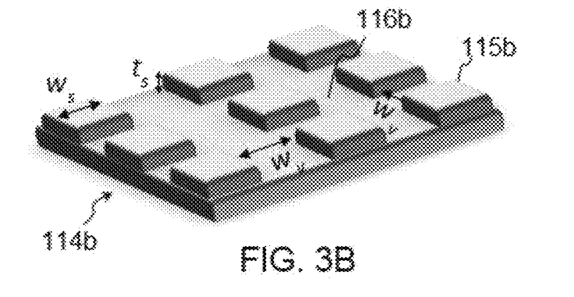
Figure 3C:
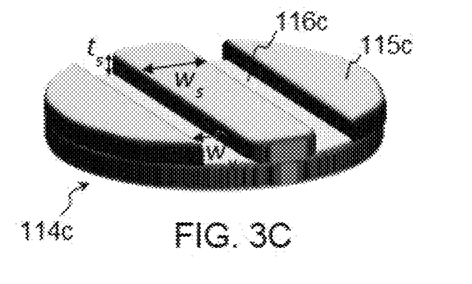
Figure 3D:
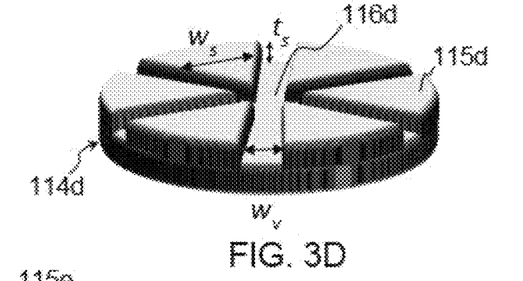
Figure 3E:
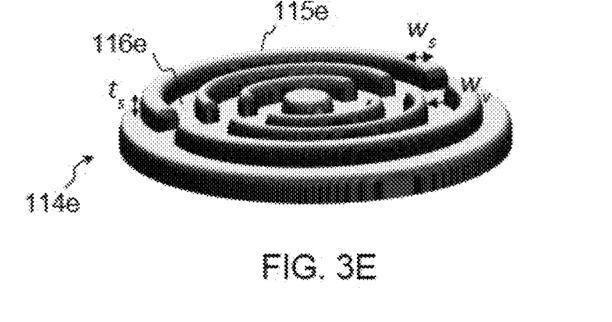

The pads 114a-d may notably have a rounded (e.g., cylindrical) shape, as in FIG. 3C, or a cuboid (e.g., parallelepiped) shape, as in FIGS. 3A, 3B, 3D, and 3E. The general shape of the pad may have little impact. More important are the channel and structure dimensions. In particular, the raised structures should preferably have dimensions that are smaller than the critical forming gas penetration length.

In that respect, the average in-plane dimension ws of the raised structures 115 is preferably between 4 and 10 μm. In other words, ws∈[4 μm; 10 μm]. Preferably though, ws∈[5 μm; 8 μm]. This dimension is measured parallel to the average plane of the pad 114. For example, this dimension corresponds to the average in-plane width of a bar (as in FIG. 3A or 3C) or to the average in-plane diameter of a mesa, as in FIG. 3B.

Sufficiently large in-plane dimensions of the raised structures 115 are preferable (i.e., at least 4 or 5 μm), to improve the low-porosity bonding area 119 with opposite pillars 124. However, the in-plane dimension of the raised structures is preferably kept below the maximal penetration length (typically 9 or 10 μm) of the reducing agent, to ensure a good lateral penetration of the latter and, in turn, a good sintering quality. The critical penetration length of formic acid is for instance estimated to be of approximately 9-10 μm.

In general, an interval of 4 to 10 μm allows a good reduction through the raised structure 115 (i.e., where the bonding pressure is typically applied) as the reducing gas can typically penetrate the paste 22a through 4 to 10 μm.

Preferably, the average thickness ts (or height) of the raised structures 115 is between 2 and 6 μm (ts∈[2 μm; 6 μm]). The thickness (or height) measured perpendicularly to the average plane of the pads 114. The thickness ts incidentally corresponds to the depth of the neighboring channels 116. Sufficiently deep channels improve the gas penetration. Preferably though, the depth ts∈[3 μm; 5 μm].

The average width wc of the channels 116 is preferably between 1 and 6 μm (wc∈[1 μm; 6 μm]). The width wc is measured in-plane with the average plane of the pads 114. This average width corresponds to the in-plane gap between two structures 115 separated by a channel. Said width can typically be as low as 1 μm and still allow a satisfactory gas penetration. On the other hand, and given the typical in-plane dimensions of the pads 114 and pillars 124 (typically a few 10s of μm), it may be necessary to limit the width of the channels, e.g., to 6 μm, so as to ensure reasonably low porosity for the interconnect area. More preferably, the average width of the channels is limited to wc∈[2 μm; 5 μm].

Owing to the limited in-plane dimensions of the pads and the interplay between the dimensions of the channels and raised structures, one may want to impose altogether all of the above dimensional constraints so as to have wc∈[1 μm; 6 μm] (or even wc∈[2 μm; 5 μm]), ts∈[2 μm; 6 μm] (or preferably ts∈[3 μm; 5 μm]) and, altogether, ws∈[4 μm; 10 μm] (or even ws∈[5 μm; 8 μm]).

A third aspect of the invention is now briefly described which concerns a set 1 of components, such as depicted in FIG. 1. As already described earlier, this set 1 includes a first interconnect component 11 (with structured metal pads 114 arranged thereon) and a second interconnect component 12, with metal pillars 124. As already described earlier, the structured pads 114 make it possible to obtain improved metal interconnects 134 with respective metal pillars 124 on the opposite substrate 121.

Most preferably, the average in-plane dimension of the pads 114 is substantially equal to that of the pillars 124 or larger (to cope with misalignment). Such dimensions are measured parallel to the respective substrates 111, 121, respectively. They may correspond to an average diameter, assuming cylindrical pads and pillars, or to the average length of an edge of the pads and pillars (if the pads and pillars are parallelepiped). In other words, the pads and pillars preferably all have matching (in-plane) dimensions. In addition, the pillars (and similarly the pads) are preferably all identical, subject to fabrication tolerances.

As said, the second interconnect component 12 may comprise electronic components in electrical communication with (at least some of) the metal pillars 124. Now, such electrical components may in fact be provided on the first substrate 111 only or on both substrates 11, 12. In the design option assumed in the accompanying drawings, the substrate 12 (e.g., a chip) comprises electrical contacts 122 (e.g., electrical lines or traces), in electrical contact with the pillars 124. Such contacts 122 may connect pillars 124 to each other, and/or may connect electrical components of the chip 12 to the pillars 124, as usual in the art.

As noted earlier too, the interconnect components 11, 12 of the set 1 may be provided separately by the manufacturer. They may further be provided altogether, but in a non-assembled state (not yet interconnected), as depicted in FIG. 1. A manufacturer may further provide only one of these components 11, 12.

Figure 2:
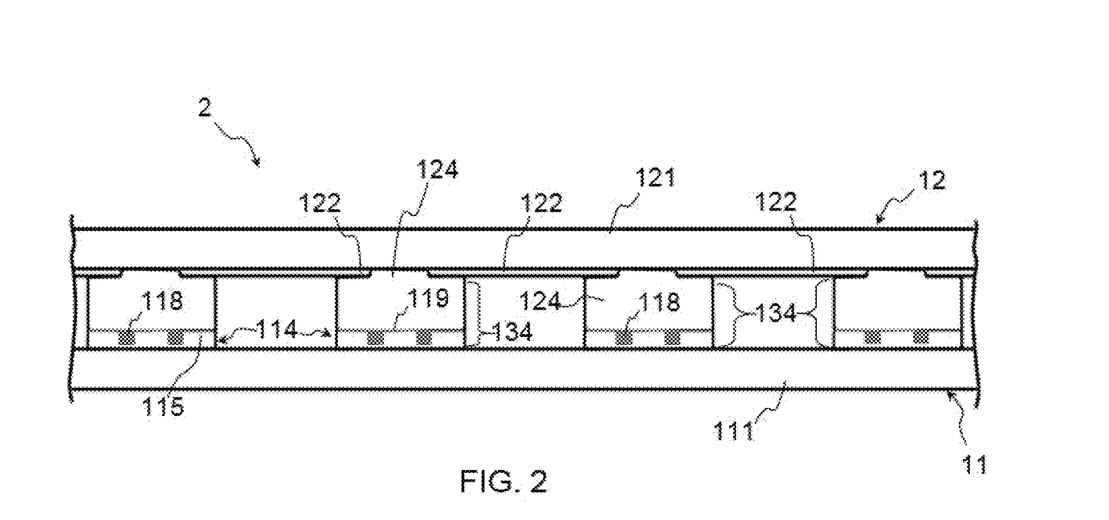
FIG. 2 shows a (wider) 2D cross-sectional view of the same components, after assembly, wherein pads and pillars are bonded thanks to a metal paste, so as to form a chip package wherein two substrate are interconnected, according to embodiments.
Figure 5:
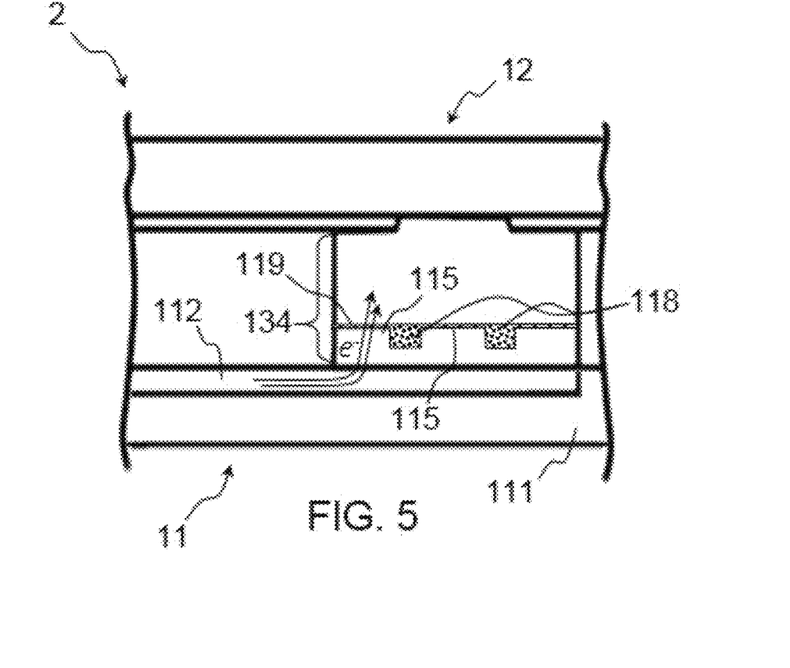
FIGS. 5 and 6 are 2D cross-sectional views focusing on a single interconnect of a device similar to that of FIG. 2, according to embodiments.
Figure 6:
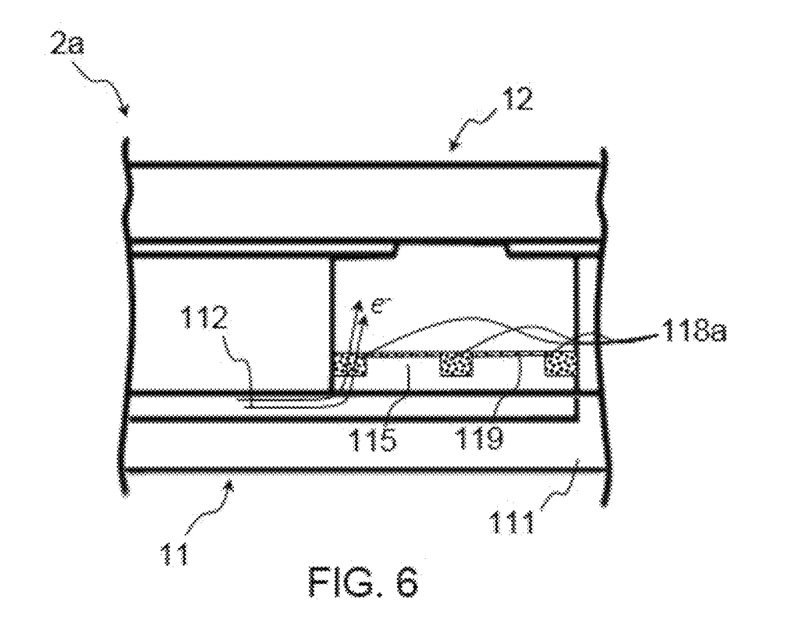

Once interconnected (e.g., using the present methods), the above set forms a set 2, 2a of interconnected components 11, 12, such as depicted in FIG. 2, 5 or 6, giving rise to interconnection areas 118, 118a, 119 (sintered metal paste 22a). Such interconnected components 11, 12 may notably be involved in chip packages of integrated circuits and comprise printed circuit boards, as usual in the art.

Referring to FIG. 2, 5, 6, once assembled and interconnected, the set 2, 2a comprises structured metal pads 114 (e.g., copper pads) that are, each, bonded to a respective, opposite one of the metal (e.g., copper) pillars 124, due to metal paste 22a. As explained earlier, the later has been sintered so as to form porous metal joints 118, 118a at the level of the channels 116. As a result, the pads 114 and opposite pillars 124 form metal interconnects 134 between the substrates 111, 121.

As also noted earlier, a thin layer 119 of sintered metal (e.g., copper) paste typically remains in the middle (i.e., in the intermediate region between the raised portions 115 of the pads 114 and the opposite pillars 124). Thus, after bonding (sintering), the joints 118, 118a are partly porous (typically 20-30% porous) in the trenches. Yet, in the intermediate regions 119 between the pillars 124 and the pedestals 115, the porosity can typically be lower than 20%, depending on whether pressure was applied or not.

As said, pressure is preferably applied during the sintering. As the temperature is raised to that aim, a reduction agent is introduced, so that the porosity of the residual paste 22a changes. Open porous joint (20-30% porosity) remains in the trenches after sintering, while a low porous joint is formed at the interface 119. Yet, the interconnects 134 may, as a whole, typically be regarded as low porous interconnects, having closed pores after sintering.

Referring now more specifically to FIGS. 5 and 6: in embodiments, the substrate 111 comprises redistribution lines 112 formed on and/or in the first substrate 111. The lines 112 connect to metal interconnects 134, at the level of respective pads 114. In operation, a redistribution line 112 allow electrical current to flow from the line 112 to the connected interconnect 134, through a respective pad 114, as depicted by curved arrows in FIGS. 5 and 6. The redistribution lines 112 may for instance be formed partly in the substrate 111, or on the latter.

Now, the channels 116 of the pads 114 may be preferably arranged so as for electrical current to essentially pass through one (or more) of the raised structures 115, as assumed in FIG. 5. More preferably yet, electrical current should essentially pass through a single one of the raised structures 115 (rather than through a porous joint 118a, as in FIG. 6). Indeed, due to current crowding effects that may occur at the points of entrance of the current into the interconnects 134 (especially in the low porosity copper region 118, which possibly results in electromigration effects), the pads 114 are preferably structured and arranged so as for electrical current to essentially pass through a single raised structure 115, before passing through a low-porosity region 119, as assumed in FIG. 5. In other words, the design and arrangement of the channels preferably consider the position of entrance of the current.

Now, because of the typical width of redistribution lines 112, it may be preferred to have electrons entering the interconnect 134 through a bar-like structure 115a (as in FIG. 3A) rather than through a series of mesas 115b (as in FIG. 3B), to avoid substantial current densities through the porous joints 118 formed at interstitial spaces (channels). In all cases, raised structures 115 should preferably be arranged at a peripheral edge of the pad (i.e., at the entrance point of the current).

The methods described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications to advanced computer products.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, other materials than those explicitly mentioned can be contemplated, in particular for the structured pads and pillars.

What is claimed is:

1. A set including:
a first interconnect component, comprising a first substrate and a set of structured metal pads arranged on a first main surface of said first substrate, wherein each of the structured metal pads comprises one or more channels, each extending in-plane with an average plane of said each of the structured metal pads, so as to form at least two raised structures thereon; and
a second interconnect component, comprising a second substrate and a set of metal pillars arranged on a second main surface of said second substrate, wherein the pads are adapted for fabricating metal interconnects with respective metal pillars on the second substrate, wherein each of the structured metal pads is bonded to a respective, opposite one of the metal pillars, using metal paste, the metal paste sintered so as to form one or more porous metal joint at a level of said one or more channels, wherein the bonded structured metal pads and opposite metal pillars form metal interconnects between the first substrate and the second substrate, wherein the first substrate further comprises redistribution lines formed on or in the first substrate, said redistribution lines connecting to the metal interconnects at a level of respective structured metal pads, so as to form an electrical current path from each of the redistribution lines to a respectively connected metal interconnect, via a respective structured metal pad, in operation, and wherein the one or more channels are arranged so as for said electrical current path to pass through one of said at least two raised structures, and wherein each of the structured metal pads comprises a plurality of channels, each extending in-plane with an average plane of each of the structured metal pads, so as to form a plurality of raised structures thereon, the metal paste sintered so as to form a porous metal joint at the level of each of the channels, the plurality of channels arranged so as for said electrical current path to pass through one structure within the plurality of raised structures.

2. The set of claim 1, wherein a first average in-plane dimension of said metal structured metal pads is substantially equal to or larger than a second average in-plane dimension of said metal pillars, wherein the first average in-plane dimension and the second average in-plane dimension are measured in-plane with the first substrate and the second substrate, respectively.

3. The set of claim 1, wherein the second interconnect component further comprises electronic components in electrical communication with at least some of the metal pillars.

* * * * *